United States Patent
Kikuchi et al.

(10) Patent No.: US 11,277,114 B2
(45) Date of Patent: Mar. 15, 2022

(54) ELASTIC WAVE DEVICE AND MANUFACTURING METHOD THEREFOR

(71) Applicant: Murata Manufacturing Co., Ltd., Nagaokakyo (JP)

(72) Inventors: Taku Kikuchi, Nagaokakyo (JP); Daisuke Sekiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 841 days.

(21) Appl. No.: 16/142,065

(22) Filed: Sep. 26, 2018

(65) Prior Publication Data

US 2019/0036510 A1 Jan. 31, 2019

Related U.S. Application Data

(63) Continuation of application No. PCT/JP2017/006316, filed on Feb. 21, 2017.

(30) Foreign Application Priority Data

Apr. 14, 2016 (JP) .............................. JP2016-080766

(51) Int. Cl.
*H01L 41/00* (2013.01)
*H02N 2/00* (2006.01)
(Continued)

(52) U.S. Cl.
CPC ............... *H03H 9/17* (2013.01); *H01L 23/04* (2013.01); *H01L 23/34* (2013.01); *H01L 23/36* (2013.01);
(Continued)

(58) Field of Classification Search
CPC .......... H03H 9/17; H03H 3/08; H03H 9/0547; H03H 9/1071; H03H 9/059; H03H 9/1042;
(Continued)

(56) References Cited

U.S. PATENT DOCUMENTS

2006/0174823 A1* 8/2006 Sung ........................ H03H 3/08
117/84
2009/0322186 A1* 12/2009 Iwashita ............ H03H 9/02086
310/348
(Continued)

FOREIGN PATENT DOCUMENTS

JP 2002-134653 A 5/2002
JP 2006-211613 A 8/2006
(Continued)

OTHER PUBLICATIONS

Official Communication issued in International Patent Application No. PCT/JP2017/006316, dated May 23, 2017.

*Primary Examiner* — Yuriy Semenenko
(74) *Attorney, Agent, or Firm* — Keating & Bennett, LLP

(57) ABSTRACT

An elastic wave device includes an interdigital transducer electrode and a wiring electrode made of metal and provided on a first main surface of a piezoelectric substrate. Via hole electrodes penetrate the piezoelectric substrate. Each via hole electrode is connected to an external connection terminal. A cover member defines a hollow space in which the interdigital transducer electrode is sealed, together with the first main surface of the piezoelectric substrate. A heat dissipating member is provided on the wiring electrode to extend from the wiring electrode toward the cover member and penetrate the cover member.

18 Claims, 5 Drawing Sheets

(51) Int. Cl.
*H03H 9/17* (2006.01)
*H01L 23/04* (2006.01)
*H01L 23/36* (2006.01)
*H03H 9/05* (2006.01)
*H03H 9/10* (2006.01)
*H01L 23/34* (2006.01)
*H03H 3/08* (2006.01)

(52) U.S. Cl.
CPC ............ *H03H 3/08* (2013.01); *H03H 9/0547* (2013.01); *H03H 9/1071* (2013.01); *H01L 2224/16145* (2013.01); *H01L 2224/16225* (2013.01); *H03H 9/059* (2013.01); *H03H 9/1042* (2013.01)

(58) Field of Classification Search
CPC ........... H03H 9/25; H01L 23/04; H01L 23/34; H01L 23/36; H01L 2224/16145; H01L 2224/16225
See application file for complete search history.

(56) References Cited

U.S. PATENT DOCUMENTS

| | | | |
|---|---|---|---|
| 2010/0277035 A1* | 11/2010 | Kudo | H03H 9/059 310/313 B |
| 2012/0299178 A1 | 11/2012 | Kanaya et al. | |
| 2013/0214640 A1 | 8/2013 | Yamazaki | |
| 2016/0079956 A1* | 3/2016 | Son | H03H 9/02086 333/187 |
| 2017/0077896 A1* | 3/2017 | Sugaya | H03H 7/38 |
| 2019/0123711 A1* | 4/2019 | Revier | H03H 3/0073 |
| 2019/0181828 A1* | 6/2019 | Iwamoto | H03H 9/02897 |
| 2021/0075398 A1* | 3/2021 | Lee | H03H 9/02015 |

FOREIGN PATENT DOCUMENTS

| | | |
|---|---|---|
| JP | 2009-159195 A | 7/2009 |
| JP | 2012-244059 A | 12/2012 |
| JP | 2013-090273 A | 5/2013 |
| WO | 2012/050016 A1 | 4/2012 |

* cited by examiner

ELASTIC WAVE DEVICE AND MANUFACTURING METHOD THEREFOR

CROSS REFERENCE TO RELATED APPLICATIONS

This application claims the benefit of priority to Japanese Patent Application No. 2016-080766 filed on Apr. 14, 2016 and is a Continuation Application of PCT Application No. PCT/JP2017/006316 filed on Feb. 21, 2017. The entire contents of each application are hereby incorporated herein by reference.

BACKGROUND OF THE INVENTION

1. Field of the Invention

The present invention relates to an elastic wave device including a via hole electrode penetrating a piezoelectric substrate, and a manufacturing method therefor.

2. Description of the Related Art

An elastic wave device having a via hole electrode formed in a piezoelectric substrate has been known. In the elastic wave device disclosed in Japanese Unexamined Patent Application Publication No. 2009-159195, an interdigital transducer electrode and a wiring electrode are provided on a piezoelectric substrate formed from a piezoelectric monocrystal, such as $LiNbO_3$. A support layer is provided so as to surround the interdigital transducer electrode and the wiring electrode. A cover member is provided on the support layer. Accordingly, the interdigital transducer electrode is sealed within a hollow space. Meanwhile, for external connection, a via hole electrode is provided in the piezoelectric substrate. One end of the via hole electrode is connected to the wiring electrode. An external connection terminal is provided on a main surface of the piezoelectric substrate at the side opposite to the side at which the wiring electrode is provided. The other end of the via hole electrode is joined to the external connection terminal.

In forming the via hole electrode, laser light is applied to the piezoelectric substrate, which is formed from $LiNbO_3$ or the like, to form a through hole therein. A metal is provided in the through hole, thus providing the via hole electrode.

For the elastic wave device disclosed in Japanese Unexamined Patent Application Publication No. 2009-159195, after the interdigital transducer electrode and the wiring electrode are provided, laser light is applied to the main surface of the piezoelectric substrate at the side opposite to the main surface of the piezoelectric substrate on which the interdigital transducer electrode is provided. Accordingly, the through hole is formed. In this case, the wiring electrode is heated by the application of the laser light. As a result, the wiring electrode may be damaged.

SUMMARY OF THE INVENTION

Preferred embodiments of the present invention provide elastic wave devices in each of which an end of a via hole electrode provided in a piezoelectric substrate is connected to a wiring electrode, the wiring electrode being unlikely to be damaged, and manufacturing methods therefor.

An elastic wave device according to a preferred embodiment of the present invention includes a piezoelectric substrate including opposing first and second main surfaces; an interdigital transducer electrode provided on the first main surface; a wiring electrode provided on the first main surface and electrically connected to the interdigital transducer electrode; a via hole electrode penetrating the piezoelectric substrate and electrically connected to the wiring electrode; an external connection terminal provided on the second main surface of the piezoelectric substrate and electrically connected to the via hole electrode; and a cover member defining a hollow space in which the interdigital transducer electrode is sealed, between the first main surface of the piezoelectric substrate and the cover member, and further includes a heat dissipating member having higher thermal conductivity than the cover member, provided on the wiring electrode, extending from the wiring electrode toward the cover member, and penetrating the cover member.

In an elastic wave device according to a preferred embodiment of the present invention, the elastic wave device further includes a support layer provided on the piezoelectric substrate and including a cavity defining the hollow space, and the cover member is joined on the support layer. In this case, it is possible to provide an elastic wave device including a WLP (wafer level packaging) package.

In an elastic wave device according to a preferred embodiment of the present invention, the heat dissipating member penetrating the support layer and the cover member is provided. In this case, since the heat dissipating member is provided in the support layer, it is possible to achieve size reduction.

In an elastic wave device according to a preferred embodiment of the present invention, the heat dissipating member and the via hole electrode are provided at a position at which a portion of the via hole electrode that is joined to the wiring electrode overlaps an end surface of the heat dissipating member that is joined to the wiring electrode, when seen in a plan view. In this case, it is possible to further effectively reduce or prevent damage of the wiring electrode due to heat.

In an elastic wave device according to a preferred embodiment of the present invention, a portion of the heat dissipating member that is joined to the wiring electrode includes the portion of the via hole electrode that is joined to the wiring electrode, when seen in a plan view. In this case, due to heat dissipation by the heat dissipating member, damage of the wiring electrode due to heat is even less likely to occur.

In an elastic wave device according to a preferred embodiment of the present invention, the elastic wave device includes a high-thermal conductivity material portion covering a portion at which the heat dissipating member is exposed, provided on an outer main surface of the cover member at a side opposite to a main surface of the cover member at the hollow space side, and having higher thermal conductivity than the cover member. In this case, the heat dissipation property is further improved, so that damage of the wiring electrode due to heat is even less likely to occur.

In an elastic wave device according to a preferred embodiment of the present invention, the high-thermal conductivity material portion is made of an external resin. In this case, it is possible to improve the heat dissipation property by using the external resin.

In an elastic wave device according to a preferred embodiment of the present invention, a shield layer made of metal is provided at an outer side portion of the external resin. In this case, it is possible to further improve the heat dissipation property.

In an elastic wave device according to a preferred embodiment of the present invention, another electronic component element laminated on the outer main surface of the cover member is provided. In this case, it is possible to reduce the size of a composite electronic component apparatus including the elastic wave device. In addition, it is possible to reduce a mounting space on a mounting substrate on which the elastic wave device is mounted.

In an elastic wave device according to a preferred embodiment of the present invention, the other electronic component element includes an external connection terminal joined to the heat dissipating member. In this case, heat from the heat dissipating member flows to the external connection terminal side of the other electronic component element. Therefore, it is possible to further improve the heat dissipation property in the elastic wave device.

A method for manufacturing the elastic wave device according to a preferred embodiment of the present invention is a method for obtaining an elastic wave device according to a preferred embodiment of the present invention and includes the steps of: preparing a structure including the piezoelectric substrate, the interdigital transducer electrode provided on the first main surface of the piezoelectric substrate, the wiring electrode provided on the first main surface and electrically connected to the interdigital transducer electrode, the cover member disposed to define the hollow space in which the interdigital transducer electrode is sealed, between the piezoelectric substrate and the first main surface, and the heat dissipating member having higher thermal conductivity than the cover member, provided on the wiring electrode, extending from the wiring electrode toward the cover member, and penetrating the cover member; applying laser light to the second main surface of the piezoelectric substrate to form a plurality of through holes penetrating from the first main surface toward the second main surface; forming the via hole electrode by disposing an electrode material in the plurality of through holes; and forming an external connection terminal on the second main surface of the piezoelectric substrate such that the external connection terminal is electrically connected to the via hole electrode.

In the elastic wave devices and the manufacturing methods therefor according to preferred embodiments of the present invention, damage of the wiring electrode is unlikely to occur.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings in order to clarify the present invention.

It should be noted that each preferred embodiment described in the present specification is illustrative, and the components in the different preferred embodiments may be partially replaced or combined.

Figure 1A:
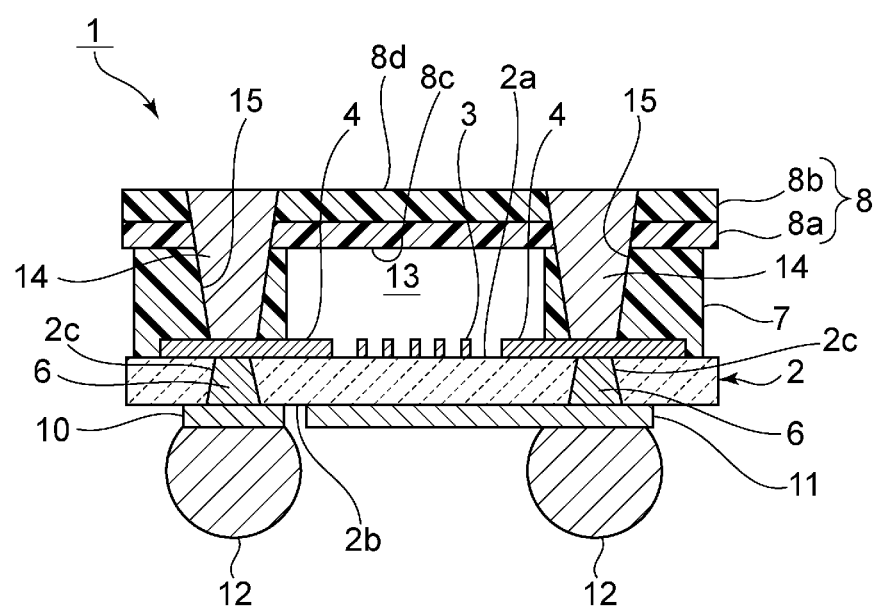
FIGS. 1A and 1B are a front cross-sectional view of an elastic wave device according to a first preferred embodiment of the present invention and a schematic partially cutaway enlarged plan view showing a positional relationship among a via hole electrode, a heat dissipating member, and a wiring electrode.

FIG. 1A is a front cross-sectional view of an elastic wave device according to a first preferred embodiment of the present invention. A piezoelectric substrate 2 includes opposing first and second main surfaces 2a and 2b. An interdigital transducer electrode 3 is provided on the first main surface 2a. Wiring electrodes 4 are also provided on the first main surface 2a. The wiring electrodes 4 are electrically connected to the interdigital transducer electrode 3.

The piezoelectric substrate 2 is made an appropriate piezoelectric material. Examples of such a piezoelectric material include piezoelectric monocrystals and piezoelectric ceramics. Examples of piezoelectric monocrystals include $LiNbO_3$, $K_2NbO_3$, $LiTaO_3$, quartz, and langasite. Examples of piezoelectric ceramics include PZT.

In the case of providing a through hole in the piezoelectric substrate 2 made of a piezoelectric monocrystal using a laser device, a laser device having high output is needed. Therefore, in the case with the piezoelectric substrate 2 made of a piezoelectric monocrystal, preferred embodiments of the present invention are effective.

The interdigital transducer electrode 3 and the wiring electrodes 4 are made of an appropriate metal. Such a metal is not particularly limited, and examples thereof include Al, Pt, Cu, Au, Ti, Mo, Ni, Cr, and Ag. In addition, alloys of these metals may be used. Furthermore, a single metal layer may be used, or a laminated metal film including a plurality of metal layers that are laminated may be used.

In the present preferred embodiment, the interdigital transducer electrode 3 defines an elastic wave resonator. However, depending on an intended function, a plurality of interdigital transducer electrodes 3 may be provided, and the number of interdigital transducer electrodes 3 is not particularly limited.

A support layer 7 is provided on the first main surface 2a. The support layer 7 surrounds a portion in which the interdigital transducer electrode 3 is provided. The material from which the support layer 7 is made is not particularly limited, but the support layer 7 is preferably made of a synthetic resin, for example, in the present preferred embodiment. As the synthetic resin, polyimide or other suitable synthetic resin may be used.

A cover member 8 is provided on the support layer 7 so as to close an upper opening of the support layer 7. The cover member 8 includes an inner main surface 8c at a hollow space 13 side, and an outer main surface 8d at the side opposite to the inner main surface 8c. The cover member 8 includes first and second cover member layers 8a and 8b. However, the cover member 8 may include only a single layer. The cover member 8 may also preferably be made of an appropriate synthetic resin.

A sealed hollow space 13 is defined by the support layer 7, the cover member 8, and the first main surface 2a of the piezoelectric substrate 2. The interdigital transducer electrode 3 is located within the hollow space 13. Through holes 2c, 2c are provided in the piezoelectric substrate 2. Each through hole 2c is provided by applying laser light to the second main surface 2b side of the piezoelectric substrate 2. Each through hole 2c penetrates the piezoelectric substrate 2 so as to extend from the first main surface 2a to the second main surface 2b. The through hole 2c is provided after the interdigital transducer electrode 3 and the wiring electrodes 4 are provided on the first main surface 2a of the piezoelectric substrate 2. Therefore, when laser light is applied to the second main surface 2b, the laser light reaches the wiring electrode 4.

After the through holes 2c are provided, via hole electrodes 6, 6 are provided by providing a metal into the through holes 2c. An end of each via hole electrode 6 is joined to the wiring electrode 4.

The other end of each via hole electrode 6 is exposed at the second main surface 2b side. Electrode pads 10 and 11 are connected to the via hole electrodes 6, 6, respectively. The electrode pads 10 and 11 are provided on the second main surface 2b. The electrode pads 10 and 11 are each preferably made of a metal film, for example.

Similar to the wiring electrodes 4, the via hole electrodes 6 and the electrode pads 10 and 11 are made of an appropriate metal or alloy.

Metal bumps 12, 12 are connected to the electrode pads 10 and 11, respectively. The metal bumps 12, 12 are preferably made of solder, Au, or other suitable material, for example.

The electrode pad 10 and the metal bump 12, and the electrode pad 11 and the metal bump 12 define external connection terminals to connect the elastic wave device 1 to the outside.

The elastic wave device 1 is mounted on a mounting substrate or other suitable substrate at the metal bumps 12, 12 side and electrically connected to the outside.

The elastic wave device 1 of the present preferred embodiment includes heat dissipating members 14, 14.

Specifically, through holes 15, 15 penetrate the support layer 7 and the cover member 8. The through holes 15, 15 may be provided by applying laser light to the outer main surface 8d side of the cover member 8. The support layer 7 and the cover member 8 are preferably made of a synthetic resin, for example. Therefore, it is possible to easily provide the through holes 15 using a low output laser at the outer main surface 8d of the cover member 8. In this case, since the output of the laser is low, and the piezoelectric substrate 2 which is thermally stable and has high mechanical strength is provided under the through holes 15, the wiring electrodes 4 are unlikely to be damaged due to heat.

The heat dissipating members 14, 14 are provided within the through holes 15. Each heat dissipating member 14 is made of a material having better thermal conductivity than the cover member 8. The heat dissipating members 14, 14 preferably have electrical conductivity. A metal, for example, is preferably used as such a material. The metal is not particularly limited, and, for example, Cu, Al, or an appropriate alloy may be used. The heat dissipating members 14, 14 made of the metal have very high thermal conductivity. In addition, the heat dissipating members 14, 14 also have electrical conductivity. However, each heat dissipating member 14 may be made of, for example, a synthetic resin or a ceramic material having higher thermal conductivity than the cover member 8.

Each heat dissipating member 14 is connected at one end thereof to the wiring electrode 4, extends from the wiring electrode 4 toward the cover member 8 side, penetrates the cover member 8, and is exposed on the outer main surface 8d.

Regarding the elastic wave device disclosed in Japanese Unexamined Patent Application Publication No. 2009-159195, when laser light is applied to the piezoelectric substrate to form a through hole, the wiring electrode may be damaged due to heat.

On the other hand, in the elastic wave device 1, since the heat dissipating members 14 are provided on the wiring electrodes 4, laser light only needs to be applied to the second main surface 2b of the piezoelectric substrate 2 after the heat dissipating members 14 are provided. In this case, even when the wiring electrodes 4 are heated by laser light when providing the through holes 2c, the heat is rapidly dissipated through the heat dissipating members 14. Therefore, the wiring electrodes 4 are unlikely to be damaged due to heat.

In producing the elastic wave device 1 of the present preferred embodiment, a structure is prepared in which the interdigital transducer electrode 3 and the wiring electrodes 4 are provided on the first main surface 2a of the piezoelectric substrate 2 and the support layer 7, the cover member 8, and the heat dissipating members 14 are further provided. Next, a plurality of through holes 2c are provided by applying laser light to the second main surface 2b of the piezoelectric substrate 2 as described above. Then, via hole electrodes 6 are formed by providing a metal into the through holes 2c. Furthermore, electrode pads 10 and 11 and metal bumps 12, 12 are external connection terminals electrically connected to the via hole electrodes 6.

Preferably, the structure in which the through holes 2c have not been provided is placed on a stage made of metal or other suitable material, such that the heat dissipating members 14 are in contact with the stage. In this state, laser light only needs to be applied to the second main surface 2b of the piezoelectric substrate 2. Since the heat dissipating members 14 are in contact with the stage made of metal or other suitable material, it is possible to more rapidly dissipate the heat of the wiring electrodes from the stage through the heat dissipating members 14.

In particular, in the present preferred embodiment, a portion of each heat dissipating member 14 that is joined to the wiring electrode 4 faces the via hole electrode 6 across the wiring electrode 4. Thus, heat generated when providing the through holes 2c is rapidly dissipated through the heat dissipating members 14.

In addition, not only during manufacturing but also during mounting, even when heat is transmitted to the wiring electrodes 4, for example, even when heat from the interdigital transducer electrode 3 side is transmitted to the wiring electrodes 4, it is possible to rapidly introduce the heat to the outside. Therefore, it is possible to effectively improve the heat dissipation property.

Figure 1B:
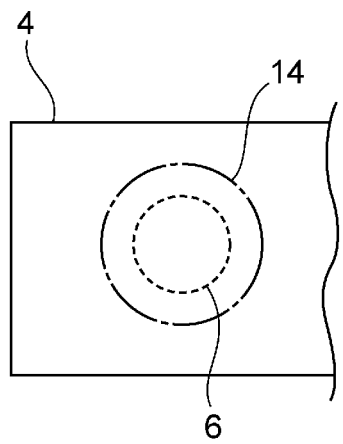

FIG. 1B is a schematic partially cutaway enlarged plan view schematically showing the positional relationship among the heat dissipating member 14, the via hole electrode 6, and the wiring electrode 4. An alternate long and short dash line indicates the outer periphery of the portion of the heat dissipating member 14 that is joined to the wiring electrode 4. A broken line indicates the outer periphery of the portion of the via hole electrode 6 that is joined to the wiring electrode 4.

As shown in FIG. 1B, the portion of the heat dissipating member 14 that is joined to the wiring electrode 4 is preferably provided at a position including the portion of the via hole electrode 6 that is joined to the wiring electrode 4 in a plan view. Accordingly, it is possible to further improve the heat dissipation effect.

However, the portion of the via hole electrode 6 that is joined to the wiring electrode 4 may partially overlap the portion of the heat dissipating member 14 that is joined to the wiring electrode 4 or may not overlap such a portion at all.

In the present preferred embodiment, the through holes 2c are preferably provided by applying laser light, but, for example, ultrasonic processing or other suitable processing may be used instead of applying laser light, or a plurality of processing methods may be used in combination. Furthermore, a physical processing method, such as sandblasting, for example, may be used. In each of the cases, since the wiring electrodes 4 are provided at the side opposite to the through holes 2c of the wiring electrode and are reinforced by the heat dissipating members 14, it is possible to effectively reduce or prevent damage due to the heat of the wiring electrodes 4 or other causes.

Therefore, in the elastic wave device 1, since the wiring electrodes 4 are unlikely to be damaged, it is possible to improve the reliability of electrical connection between the interdigital transducer electrode 3 and the electrode pads 10 and 11, which are external connection terminals. In addition, the sealability is unlikely to deteriorate, and it is also possible to improve the yield the reliability of moisture resistance.

Figure 2:
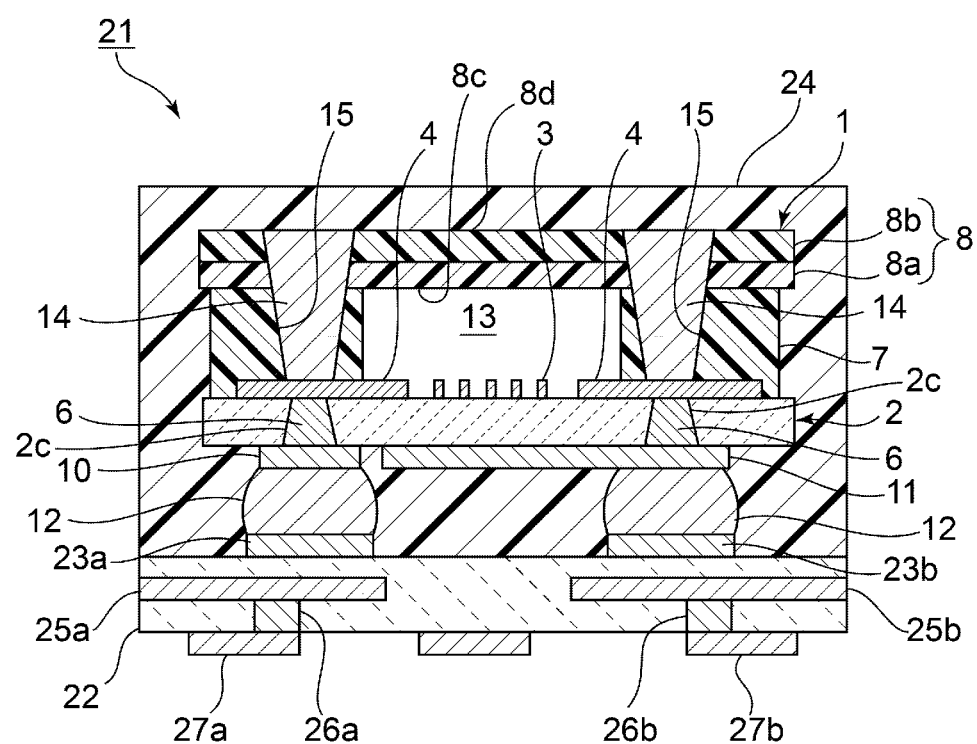
FIG. 2 is a front cross-sectional view of an elastic wave device according to a second preferred embodiment of the present invention.

FIG. 2 is a front cross-sectional view of an elastic wave device according to a second preferred embodiment of the present invention. In the elastic wave device 21, an elastic wave device 1 that is configured in the same or similar manner as in the first preferred embodiment is mounted on a module substrate 22. Although not shown in FIG. 2, electronic components other than the elastic wave device 1 are also mounted on the module substrate 22. Electrode lands 23a and 23b are provided on the module substrate 22. The metal bumps 12, 12 of the elastic wave device 1 are joined to the electrode lands 23a and 23b, respectively. An external resin layer 24 covers the elastic wave device 1. The external resin layer 24 is preferably made of, for example, a synthetic resin. The external resin layer 24 is preferably made of a resin having higher thermal conductivity than the cover member 8. Accordingly, it is possible to effectively introduce the heat of the heat dissipating members 14 to the external resin layer 24 side. Therefore, it is possible to more effectively reduce or prevent damage of the wiring electrodes 4 made of metal. Internal electrodes 25a and 25b and via hole electrodes 26a and 26b are provided within the module substrate 22. The upper ends of the via hole electrodes 26a and 26b are electrically connected to the internal electrodes 25a and 25b, respectively. The lower ends of the via hole electrodes 26a and 26b are connected to terminal electrodes 27a and 27b, respectively. The terminal electrodes 27a and 27b are provided on the lower surface of the module substrate 22. The internal electrodes 25a and 25b are electrically connected to the electrode lands 23a and 23b at portions thereof that are not shown.

The electrode lands 23a and 23b are electrically connected as appropriate to other electronic components mounted on the module substrate 22.

As in the elastic wave device 21, the external resin layer 24 may cover the outer main surface 8d of the cover member 8. The heat dissipation property is improved by the external resin layer 24 having higher thermal conductivity than the cover member 8. Therefore, it is preferable to provide such an external resin layer 24 having high thermal conductivity.

The other points of the elastic wave device 21 are the same or substantially the same as those of the elastic wave device 1 of the first preferred embodiment. Thus, the same portions are designated by the same reference signs, and the description thereof is omitted. In the present preferred embodiment as well, since the heat dissipating members 14 are provided, the wiring electrodes 4 are unlikely to be damaged when providing the through holes 2c. In addition, heat is rapidly introduced to the external resin layer 24 side through the heat dissipating members 14.

Figure 3:
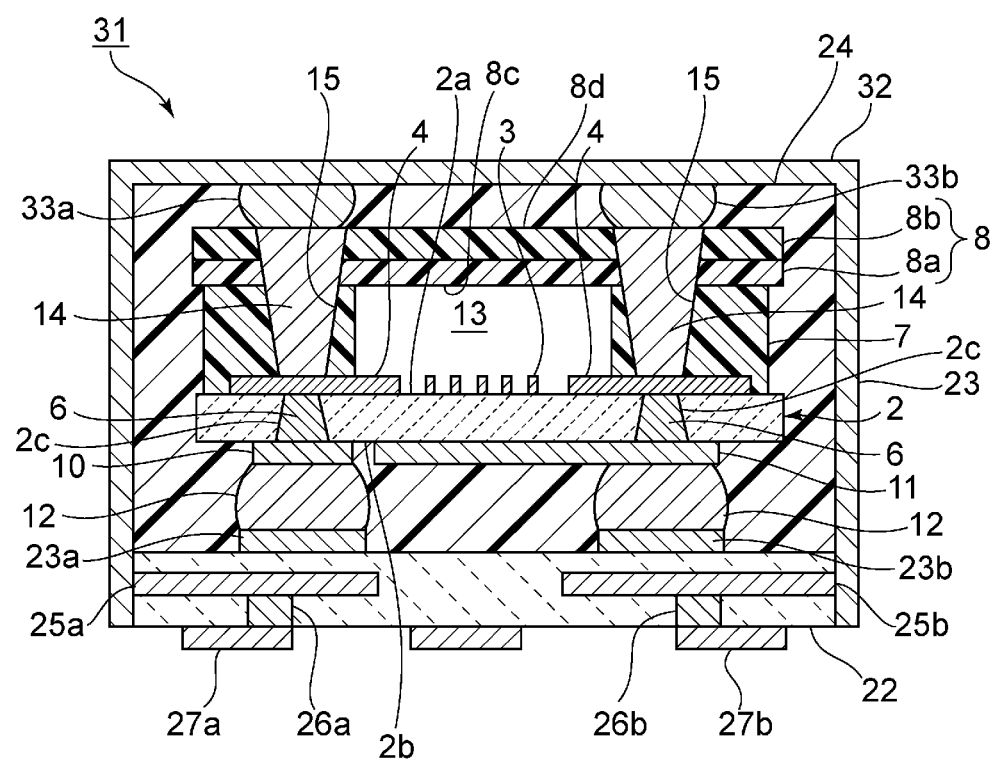
FIG. 3 is a front cross-sectional view of an elastic wave device according to a third preferred embodiment of the present invention.

FIG. 3 is a front cross-sectional view of an elastic wave device according to a third preferred embodiment of the present invention. In the elastic wave device 31, a shield layer 32 made of metal covers the outer surface of the external resin layer 24. The shield layer 32 also preferably covers the side surface of the module substrate 22, but may not cover the side surface of the module substrate 22.

Preferably, in order to improve an electromagnetic shielding property, the shield layer 32 also covers the side surface of the module substrate 22 as shown.

In addition, in the elastic wave device 31, metal bumps 33a and 33b are provided on the heat dissipating members 14, respectively. The metal bumps 33a and 33b are joined to the shield layer 32. The metal bumps 33a and 33b and the shield layer 32 are made of metal, and thus, have higher thermal conductivity than the cover member 8. Therefore, it is possible to rapidly introduce heat introduced to the heat dissipating members 14, to the shield layer 32 through the metal bumps 33a and 33b. Thus, in the elastic wave device 31, it is possible to further improve the heat dissipation property.

In the elastic wave device 31, the external resin layer is preferably made of a material having higher thermal conductivity than the cover member 8. However, since heat is rapidly dissipated through the metal bumps 33a and 33b and the shield layer 32, the external resin layer 24 may be made of a material having lower thermal conductivity than the cover member 8. The other points of the elastic wave device 31 are the same or substantially the same as those of the elastic wave device 21. Thus, the same portions are designated by the same reference signs, and the description thereof is omitted. In the present preferred embodiment as well, since the heat dissipating members 14 are provided, it is possible to assuredly reduce or prevent damage of the wiring electrodes 4.

Figure 4:
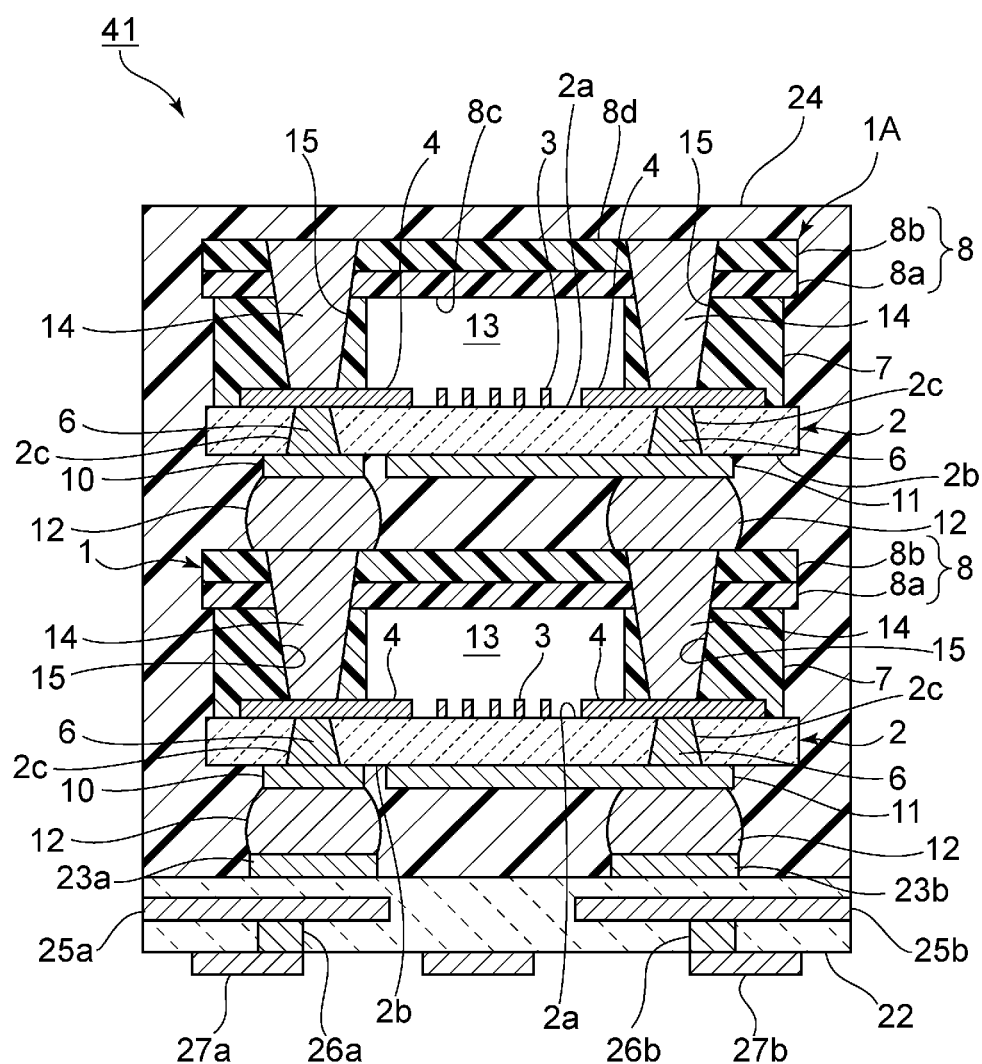
FIG. 4 is a front cross-sectional view of an elastic wave device according to a fourth preferred embodiment of the present invention.

FIG. 4 is a front cross-sectional view of an elastic wave device according to a fourth preferred embodiment of the present invention. In the elastic wave device 41, another elastic wave device 1A is laminated on the elastic wave device 1 of the first preferred embodiment in the elastic wave device 21 of the second preferred embodiment. The other points of the elastic wave device 41 are the same or substantially the same as those of the second elastic wave device 21.

Metal bumps 12, 12 of the elastic wave device 1A are joined to the heat dissipating members 14, 14 of the lower elastic wave device 1. Therefore, heat generated in the wiring electrodes 4 of the lower elastic wave device 1 is introduced to the metal bumps 12 through the heat dissipating members 14 and dissipated. In the present preferred embodiment as well, the external resin layer 24 is preferably made of a resin having higher thermal conductivity than the cover member 8. Therefore, introduced heat is rapidly dissipated. Accordingly, during use, even when the interdigital transducer electrode 3 generates heat, the heat is rapidly dissipated to the outside.

Thus, in the elastic wave device 41, in each of the elastic wave devices 1 and 1A, it is possible to effectively improve the heat dissipation property.

In addition, during manufacturing as well, even when application of laser light or other suitable processing is used to form the through holes 2c before the external resin layer 24 is provided, damage of the wiring electrodes 4, which are formed from metal, due to heat are unlikely to occur since heat is dissipated by the heat dissipating members 14. Because of this, for example, the through holes 2c are formed before the elastic wave device 1A is laminated on the elastic wave device 1. In this case, the cover member 8 side at which the heat dissipating members 14 are provided is placed on a stage made of a metal having better thermal conductivity than the cover member 8. In this state, the through holes 2c are formed in the piezoelectric substrate 2 by application of laser light or other suitable processing. In this case, it is possible to dissipate heat generated in the wiring electrodes 4, which are formed from metal, to the heat dissipating members 14. Then, the heat is dissipated to the stage made of metal. Thus, similar to the elastic wave device 1 of the first preferred embodiment, damage of the wiring electrodes 4 due to heat is unlikely to occur.

Figure 5:
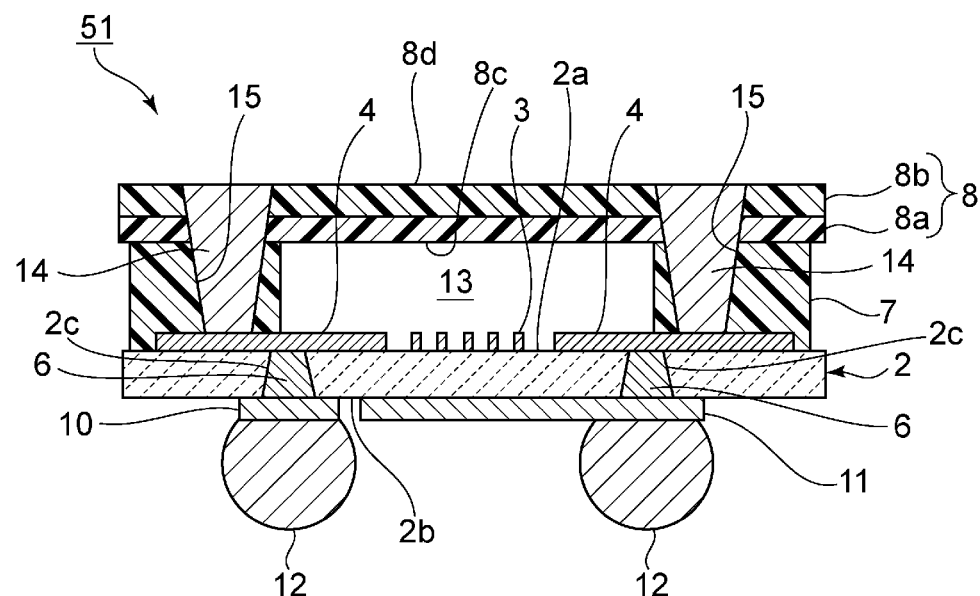
FIG. 5 is a front cross-sectional view for explaining a modification of the elastic wave device according to the first preferred embodiment of the present invention.

FIG. 5 is a front cross-sectional view for explaining a modification of the elastic wave device according to the first preferred embodiment. In the elastic wave device 51, the portion of each heat dissipating member 14 that is joined to the wiring electrode 4 does not overlap the via hole electrode 6 in a plan view. That is, each heat dissipating member 14 is located outward of the via hole electrode 6 from the hollow space 13. As described above, the portion of each heat dissipating member 14 that is joined to the wiring electrode 4 may not overlap the portion of the via hole electrode 6 that is joined to the wiring electrode 4, in a plan view.

In the above-described preferred embodiments, the cover member 8 is preferably laminated on the support layer 7, but the structure of the cover member 8 is not limited thereto. That is, a cover member that includes a portion opposing the first main surface 2a of the piezoelectric substrate 2 and has an appropriate shape to define the hollow space 13 may be used. Such a cover member is not limited to a flat plate-shaped cover member, and a cap-shaped cover member including an outer peripheral portion extending toward the piezoelectric substrate 2 side may be used.

Figure 6:
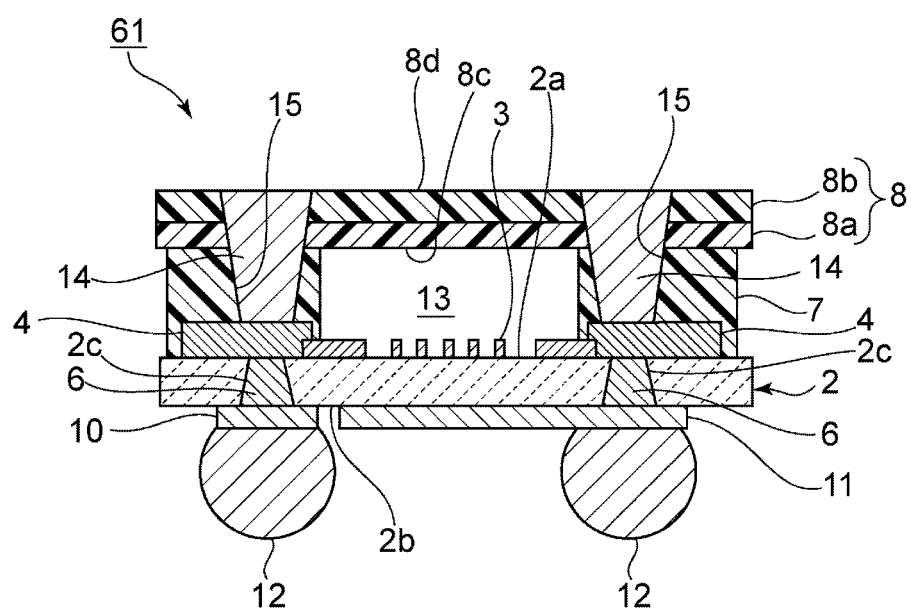
FIG. 6 is a front cross-sectional view showing a modification of the elastic wave device according to the first preferred embodiment of the present invention.

FIG. 6 is a front cross-sectional view showing a modification of the elastic wave device of the first preferred embodiment. In the elastic wave device 61 of the modification, wiring electrodes 4, 4 cover end portions of the interdigital transducer electrode 3. As described above, the wiring electrodes thicker than the interdigital transducer electrode 3 are preferably provided. In this case, when the through holes 2c are formed by application of laser light, it is possible to effectively reduce or prevent deterioration of the wiring electrodes 4.

In addition, the heat dissipating members 14 may not penetrate the through holes 2c provided in the support layer 7, and may extend from the wiring electrodes 4 through the hollow space 13 to the cover member 8. Furthermore, the heat dissipating members 14 may have any suitable shapes from the wiring electrodes 4 to the outer main surface of the cover member. In a case as well, heat generated in the wiring electrodes 4 is rapidly dissipated to the heat dissipating members 14. Therefore, similar to the first to fourth preferred embodiments, damage of the wiring electrodes 4 made of metal is unlikely to occur when providing the through holes 2c. In addition, even during use, it is possible to effectively improve a heat dissipation property.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
    a piezoelectric substrate including opposing first and second main surfaces;
    an interdigital transducer electrode provided on the first main surface;
    a wiring electrode provided on the first main surface and electrically connected to the interdigital transducer electrode;
    a via hole electrode penetrating the piezoelectric substrate and electrically connected to the wiring electrode;
    an external connection terminal provided on the second main surface of the piezoelectric substrate and electrically connected to the via hole electrode;
    a cover member defining a hollow space in which the interdigital transducer electrode is sealed, between the first main surface of the piezoelectric substrate and the cover member; and
    a heat dissipating member having higher thermal conductivity than the cover member, provided on the wiring electrode, extending from the wiring electrode toward the cover member, and penetrating the cover member.

2. The elastic wave device according to claim 1, further comprising:
    a support layer provided on the piezoelectric substrate and including a cavity defining the hollow space; wherein
    the cover member is joined on the support layer.

3. The elastic wave device according to claim 2, wherein the heat dissipating member penetrating the support layer and the cover member is provided.

4. The elastic wave device according to claim 1, wherein the heat dissipating member and the via hole electrode are provided at a position at which a portion of the via hole electrode that is joined to the wiring electrode overlaps an end surface of the heat dissipating member that is joined to the wiring electrode, when seen in a plan view.

5. The elastic wave device according to claim 4, wherein a portion of the heat dissipating member that is joined to the wiring electrode includes the portion of the via hole electrode that is joined to the wiring electrode, when seen in a plan view.

6. The elastic wave device according to claim 1, further comprising a high-thermal conductivity material portion covering a portion at which the heat dissipating member is exposed, provided on an outer main surface of the cover member at a side opposite to a main surface of the cover member at a side of the hollow space, and having higher thermal conductivity than the cover member.

7. The elastic wave device according to claim 6, wherein the high-thermal conductivity material portion is defined by an external resin layer.

8. The elastic wave device according to claim 7, wherein a shield layer made of metal is provided at an outer side portion of the external resin layer.

9. The elastic wave device according to claim 1, further comprising another electronic component element laminated on an outer main surface of the cover member.

10. The elastic wave device according to claim 9, wherein the other electronic component element includes another external connection terminal joined to the heat dissipating member.

11. A method for manufacturing the elastic wave device according to claim 1, the method comprising:
preparing a structure including the piezoelectric substrate, the interdigital transducer electrode provided on the first main surface of the piezoelectric substrate, the wiring electrode provided on the first main surface and electrically connected to the interdigital transducer electrode, the cover member defining the hollow space in which the interdigital transducer electrode is sealed, between the piezoelectric substrate and the first main surface, and the heat dissipating member having higher thermal conductivity than the cover member, provided on the wiring electrode, extending from the wiring electrode toward the cover member, and penetrating the cover member;
applying laser light to the second main surface of the piezoelectric substrate to form a plurality of through holes penetrating from the first main surface toward the second main surface;
forming the via hole electrode by disposing an electrode material in the plurality of through holes; and
forming an external connection terminal on the second main surface of the piezoelectric substrate such that the external connection terminal is electrically connected to the via hole electrode.

12. The method for manufacturing the elastic wave device according to claim 11, further comprising:
providing a support layer on the piezoelectric substrate and including a cavity defining the hollow space; wherein
the cover member is joined on the support layer.

13. The method for manufacturing the elastic wave device according to claim 12, wherein the heat dissipating member penetrating the support layer and the cover member is provided.

14. The method for manufacturing the elastic wave device according to claim 11, wherein the heat dissipating member and the via hole electrode are provided at a position at which a portion of the via hole electrode that is joined to the wiring electrode overlaps an end surface of the heat dissipating member that is joined to the wiring electrode, when seen in a plan view.

15. The method for manufacturing the elastic wave device according to claim 14, wherein a portion of the heat dissipating member that is joined to the wiring electrode includes the portion of the via hole electrode that is joined to the wiring electrode, when seen in a plan view.

16. The method for manufacturing the elastic wave device according to claim 11, further comprising:
covering a portion at which the heat dissipating member is exposed with a high-thermal conductivity material portion; wherein
the high-thermal conductivity material portion is provided on an outer main surface of the cover member at a side opposite to a main surface of the cover member at a side of the hollow space, and has higher thermal conductivity than the cover member.

17. The method for manufacturing the elastic wave device according to claim 16, wherein the high-thermal conductivity material portion is defined by an external resin layer.

18. The method for manufacturing the elastic wave device according to claim 17, wherein a shield layer made of metal is provided at an outer side portion of the external resin layer.

* * * * *